(12) United States Patent
Murphy et al.

(10) Patent No.: US 7,488,951 B2
(45) Date of Patent: Feb. 10, 2009

(54) ION SOURCE INCLUDING MAGNET AND MAGNET YOKE ASSEMBLY

(75) Inventors: Nestor P. Murphy, Oxford, MI (US); David E. Rock, Sylvania, OH (US)

(73) Assignee: Guardian Industries Corp., Auburn Hills, MI (US)

( * ) Notice: Subject to any disclaimer, the term of this patent is extended or adjusted under 35 U.S.C. 154(b) by 237 days.

(21) Appl. No.: 11/509,076

(22) Filed: Aug. 24, 2006

(65) Prior Publication Data

US 2008/0048127 A1 Feb. 28, 2008

(51) Int. Cl.
*H01J 7/24* (2006.01)
(52) U.S. Cl. .................................. 250/423 R
(58) Field of Classification Search ............. 250/423 R, 250/426, 427
See application file for complete search history.

(56) References Cited

U.S. PATENT DOCUMENTS

| | | | |
|---|---|---|---|
| 5,026,471 A * | 6/1991 | Latz et al. .............. | 204/298.19 |
| 6,359,388 B1 | 3/2002 | Petrmichl | |
| 6,812,648 B2 | 11/2004 | Luten et al. | |
| 6,815,690 B2 | 11/2004 | Veerasamy et al. | |
| 6,987,364 B2 | 1/2006 | Petrmichl | |
| 6,988,463 B2 | 1/2006 | Veerasamy et al. | |
| 7,030,390 B2 | 4/2006 | Veerasamy et al. | |
| 2006/0097645 A1 * | 5/2006 | Horsky .................. | 315/111.81 |

* cited by examiner

*Primary Examiner*—Kiet T Nguyen
(74) *Attorney, Agent, or Firm*—Nixon & Vanderhye P.C.

(57) ABSTRACT

An ion source is provided which is capable of generating and/or emitting an ion beam which may be used to deposit a layer on a substrate or to perform other functions. In certain example embodiments, a magnet yoke assembly used in the ion source is provided, and the magnet yoke assembly includes a lower yoke and an upper yoke. At least one magnet is disposed between the lower yoke and the upper yoke, with the at least one magnet having a substantially rectangular shape in certain example embodiments. The at least one magnet may be adhered to the lower yoke and/or the upper yoke.

22 Claims, 7 Drawing Sheets

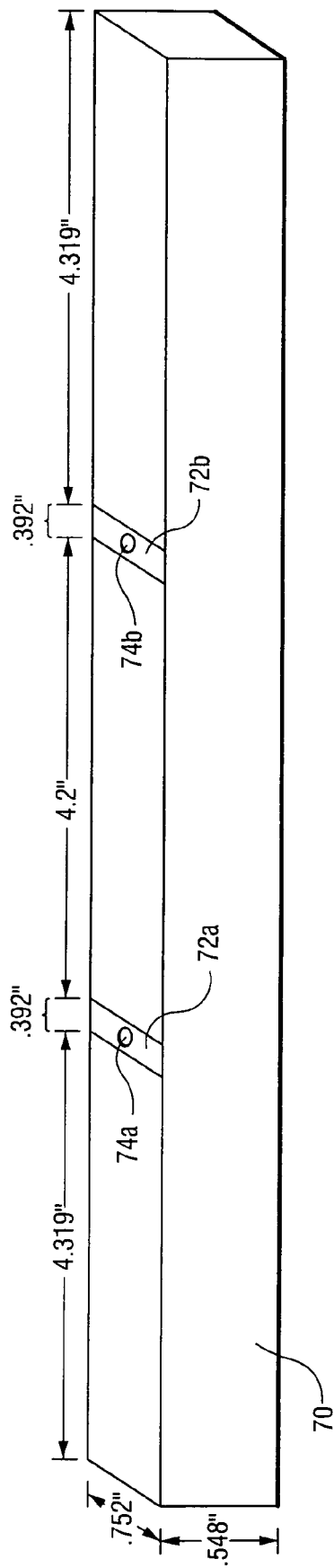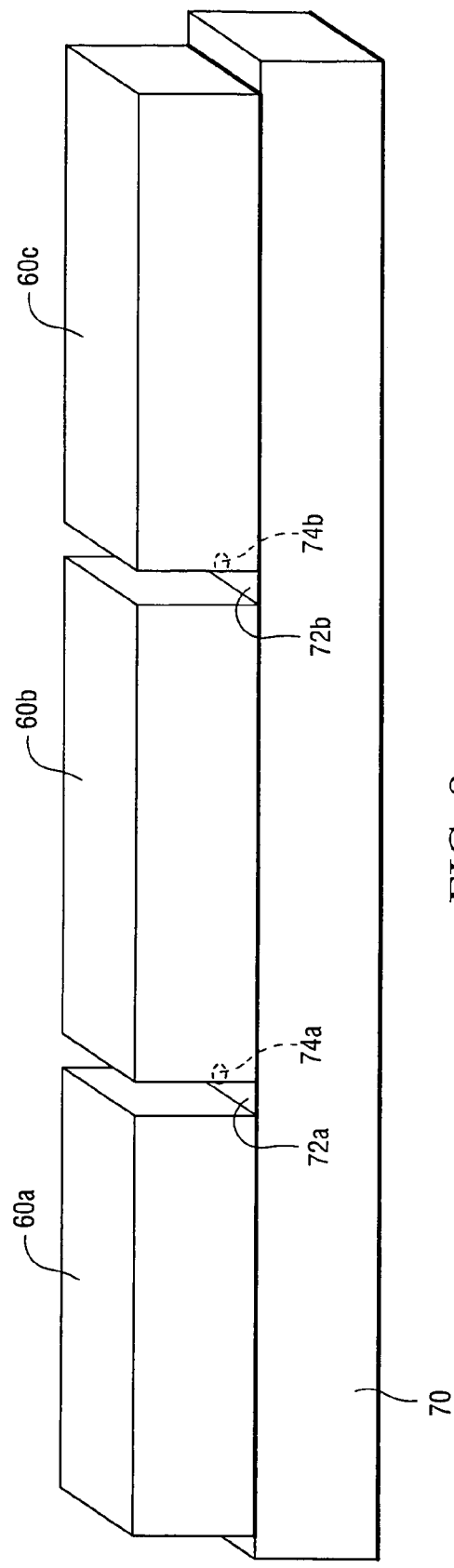
FIG. 7
FIG. 8

ION SOURCE INCLUDING MAGNET AND MAGNET YOKE ASSEMBLY

FIELD OF THE INVENTION

This invention relates to an ion source for generating an ion beam (diffuse, focused, or collimated beam). In certain example embodiments, a magnet yoke assembly for holding magnets is provided which may reduce manufacturing and/or maintenance costs associated with conventional ion sources and which may provide a simplified magnet system that is easy to produce and/or maintain.

BACKGROUND AND SUMMARY OF EXAMPLE EMBODIMENTS OF THE INVENTION

An ion source is a device that causes gas molecules to be ionized and then accelerates and emits the ionized gas molecules and/or atoms in a beam towards a substrate. Such an ion beam may be used for various purposes, including but not limited to cleaning a substrate, activation, polishing, etching, and/or deposition of thin-film coatings/layer(s). Example ion sources are disclosed, for example, in U.S. Pat. Nos. 7,030,390; 6,988,463; 6,987,364; 6,815,690; 6,812,648; 6,359,388; and application Ser. No. 10/986,456, the disclosures of which are all hereby incorporated herein by reference.

FIGS. 1-2 illustrate a conventional cold-cathode type ion source. In particular, FIG. 1 is a side cross-sectional view of an ion beam source with an ion beam emitting slit defined in the cathode, and FIG. 2 is a corresponding sectional plan view along section line II-II of FIG. 1. FIG. 3 is a sectional plan view similar to FIG. 2, for purposes of illustrating that the FIG. 1 ion beam source may have an oval and/or racetrack-shaped ion beam emitting slit as opposed to a circular ion beam emitting slit. Any other suitable shape also may be used.

Referring to FIGS. 1-5, the ion source includes a hollow housing made of a magnetoconductive material such as steel, which is used as a cathode 5. Cathode 5 includes cylindrical or oval side wall 7, a closed or partially closed bottom wall 9, and an approximately flat top wall 11 in which a circular or oval ion emitting slit and/or aperture (also sometimes referred to as a "discharge gap") 15 is defined. The bottom wall 9 and side walls 7 of the cathode 5 are optional. Ion emitting slit/aperture 15 includes an inner periphery as well as an outer periphery. Deposit and/or maintenance gas supply aperture or hole(s) 21 is/are formed in bottom wall 9. Flat top wall 11 functions as an accelerating electrode. A magnetic system including a cylindrical permanent magnet 23 with poles N and S of opposite polarity is placed inside the housing between bottom wall 9 and top wall 11. The N-pole faces flat top wall 11, while the S-pole faces bottom wall 9. The purpose of the magnetic system with a closed magnetic circuit formed by the magnet 23 and cathode 5 is to induce a substantially transverse magnetic field (MF) in an area proximate to ion emitting slit 15.

The ion source may be entirely or partially within conductive wall 50, and/or wall 50 may at least partially define the deposition chamber. In certain instances, wall 50 may entirely surround the source and substrate 45, while in other instances the wall 50 may only partially surround the ion source and/or substrate.

A circular or oval shaped conductive anode 25, electrically connected to the positive pole of electric power source 29, is arranged so as to at least partially surround magnet 23 and be approximately concentric therewith. Anode 25 may be fixed inside the housing by way of insulative ring 31 (e.g., of ceramic). Anode 25 defines a central opening therein in which magnet 23 is located. The negative pole of electric power source 29 may be grounded and connected to cathode 5, so that the cathode is negative with respect to the anode. Generally speaking, the anode 25 is generally biased positive by several thousand volts. Meanwhile, the cathode (the term "cathode" as used herein includes the inner and/or outer portions thereof) is generally held at ground potential although it need not be. This is the case during aspects of source operation, including during a mode in which the source is being cleaned.

The conventional ion beam source of FIGS. 1-5 is intended for the formation of a unilaterally directed approximately tubular ion beam, flowing in the direction toward substrate 45. Substrate 45 may or may not be biased in different instances. The ion beam emitted from the area of slit/aperture 15 is in the form of a circle in the FIG. 2 embodiment and in the form of an oval (e.g., race-track) in the FIG. 3 embodiment.

The conventional ion beam source of FIGS. 1-5 operates as follows in a depositing mode when it is desired that the ion beam from the source deposit at least one layer on substrate 45. A vacuum chamber in which the substrate 45 and slit/aperture 15 are located is evacuated, and a depositing gas (e.g., a hydrocarbon gas such as acetylene, or the like) is fed into the interior of the source via aperture(s) 21 or in any other suitable manner. A maintenance gas (e.g., argon) may also be fed into the source in certain instances, along with the depositing gas. Power supply 29 is activated and an electric field is generated between anode 25 and cathode 5, which accelerates electrons to high energy. Anode 25 is positively biased by several thousand volts, and cathode 5 may be at ground potential as shown in FIG. 1. Electron collisions with the gas in, and/or proximate to, aperture/slit 15 leads to ionization and a plasma is generated. "Plasma" herein means a cloud of gas including ions of a material to be accelerated toward substrate 45. The plasma expands and fills (or at least partially fills) a region including slit/aperture 15. An electric field is produced in slit 15, oriented in the direction substantially perpendicular to the transverse magnetic field, which causes the ions to propagate toward substrate 45. Electrons in the ion acceleration space in and/or proximate to slit/aperture 15 are propelled by the known E×B drift in a closed loop path within the region of crossed electric and magnetic field lines proximate to slit/aperture 15. These circulating electrons contribute to ionization of the gas (the term "gas" as used herein means at least one gas), so that the zone of ionizing collisions extends beyond the electrical gap between the anode and cathode and includes the region proximate to slit/aperture 15 on one and/or both sides of the cathode 5. For purposes of example, consider the situation where a silane and/or acetylene ($C_2H_2$) depositing gas is/are utilized by the ion source of FIGS. 1-3 in a depositing mode. The silane and/or acetylene depositing gas passes through the gap between anode 25 and cathode 5.

Magnet 23 will now be described in more detail with reference to FIGS. 4 and 5. In conventional systems, magnet 23 typically is a magnet system comprising multiple magnets. One known magnet system comprises a plurality of stacked magnets 24, with multiple stacks being disposed throughout the ion source. For example, FIG. 4 shows a stack of magnets 24 used in a known magnet system. As shown in FIG. 4, each magnet stack 24 is comprised of six cylindrically-shaped magnets 24a, 24b, 24c, 24d, 24e and 24f stacked on top of each other so as to form a cylinder. In one commercially available source, each magnet stack 24 in the magnet system is comprised of a plurality of 0.25×0.75" Dia. magnets, stacked six deep.

FIG. 5 is a sectional view similar to FIG. 3, taken along section line II-II in FIG. 1, showing in detail how the stacks of magnets included in the magnet system are disposed throughout the ion source. A series of bores 27*a*, 27*b*, 27*c*, 27*d*, 27*e* and 27*f* are disposed throughout the length of the ion source, and each bore is configured to receive a magnet stack 24 comprising cylindrical magnets 24*a-f*. It will be appreciated that the size, location, and number of bores shown in FIG. 5 are provided by way of example only and are not limiting. The number of bores 27 may vary based on, for example, the desired geometry of the ion source, etc. Typically, each magnet stack 24 is placed into a bore 27. It is noted that the magnets 24*a-f* of a magnet stack 24 are not attached to one another (e.g. they are not bonded, adhered, or screwed together, etc.).

Unfortunately, the ion source of FIGS. 1-5 suffers several drawbacks. For example, the design is difficult to produce. Each magnet 24*a-f* in the magnet stack 24 is small and round. Thus, a considerable amount of material is sacrificed during machining to make these parts. It similarly may be difficult and/or costly to create a large number of appropriately shaped bores 27 into which the magnet stacks 24 can be received.

Also, as a result of the operation of the ion source, the magnets may move around within the bores. Unfortunately, this may tend to damage the magnets in certain instances, ultimately affecting the magnetic flux density produced by the ion source (e.g. as a result of air gaps created by damaged magnets which are soft and fragile). Similarly, because the magnets may move around and are not fixed to one another (or fixed to any other more permanent structure in the ion source such as, for example, the anode 25), foreign material may enter the bores. Again, resulting air gaps may affect (e.g., reduce) the magnetic flux density in the effected area which is not desirable. The need to keep the ion source and the surrounding environment clean thus may be desirable to ensure that the ion source functions properly.

Thus, it will be appreciated that there exists a need in the art for an ion source that overcomes one or more of thee above problems and/or other disadvantages.

Certain example embodiments provide a magnet yoke assembly for use in an ion source. In certain example embodiments, the magnet yoke may be made of or include a lower yoke and an upper yoke. At least one magnet may be disposed between the lower yoke and the upper yoke. The at least one magnet may have a substantially rectangular prism shape in certain example embodiments. The at least one magnet may be adhered to the lower yoke and/or the upper yoke in certain example embodiments of this invention.

Certain other example embodiments provide an ion source capable of emitting an ion beam. Such example embodiments may comprise an anode and a cathode, with one of the anode and cathode having a discharge gap defined therein. A power supply may be in electrical communication with the anode and/or the cathode. At least one magnet yoke assembly may be operable to generate a magnetic field proximate to the discharge gap. The at least one magnetic yoke assembly may comprise a lower yoke and an upper yoke. At least one magnet may be disposed between the lower yoke and the upper yoke, and the at least one magnet may have a substantially rectangular prism shape. The at least one magnet may be adhered to the lower yoke and/or the upper yoke.

In certain non-limiting embodiments, two, three or more magnets may be disposed between the lower yoke and the upper yoke.

In certain other example embodiments, the magnet yoke assembly may further comprise at least two screw holes formed in each of the lower yoke and the upper yoke. A plate may be aligned with each screw hole, with each plate (e.g., screw plate) being disposed on a magnet-facing surface of the lower yoke and/or upper yoke. The screw holes and the plates may be configured to receive bolts or other types of fasteners. Each plate on the lower yoke and each screw hole on the lower yoke may be threaded in certain example embodiments. Each screw plate on the upper yoke may protrude therefrom forming protrusions and recessions, and each screw plate on the lower yoke may protrude therefrom forming protrusions and recessions. At least one magnet may be disposed between and/or outside of the recessions in certain example embodiments of this invention.

Certain other example embodiments may provide a method of assembling a magnet yoke for an ion source. Such example methods may comprise providing a lower yoke and an upper yoke. At least one substantially rectangular prism-shaped magnet may be positioned between the upper yoke and the lower yoke. The at least one magnet may be adhered to the upper yoke and/or the lower yoke. In certain example embodiments, the upper yoke and the lower yoke may be bolted or otherwise coupled through at least two fastener holes or the like formed in the lower yoke and at least two fastener holes formed in the upper yoke, the at least two fastener holes of the lower yoke and the at least two fastener holes of the upper yoke being aligned. In certain example instances, the magnet yoke may be inserted such that a bottom of an inner cathode of the ion source rests on top of the upper yoke of the magnetic yoke.

BRIEF DESCRIPTION OF THE DRAWINGS

These and other features and advantages will be better and more completely understood by reference to the following detailed description of exemplary illustrative embodiments in conjunction with the drawings, of which:

FIG. 7 is a sample lower yoke in accordance with an example embodiment;

FIG. 8 shows sample magnets placed on a lower yoke in accordance with an example embodiment;

Figure 1:
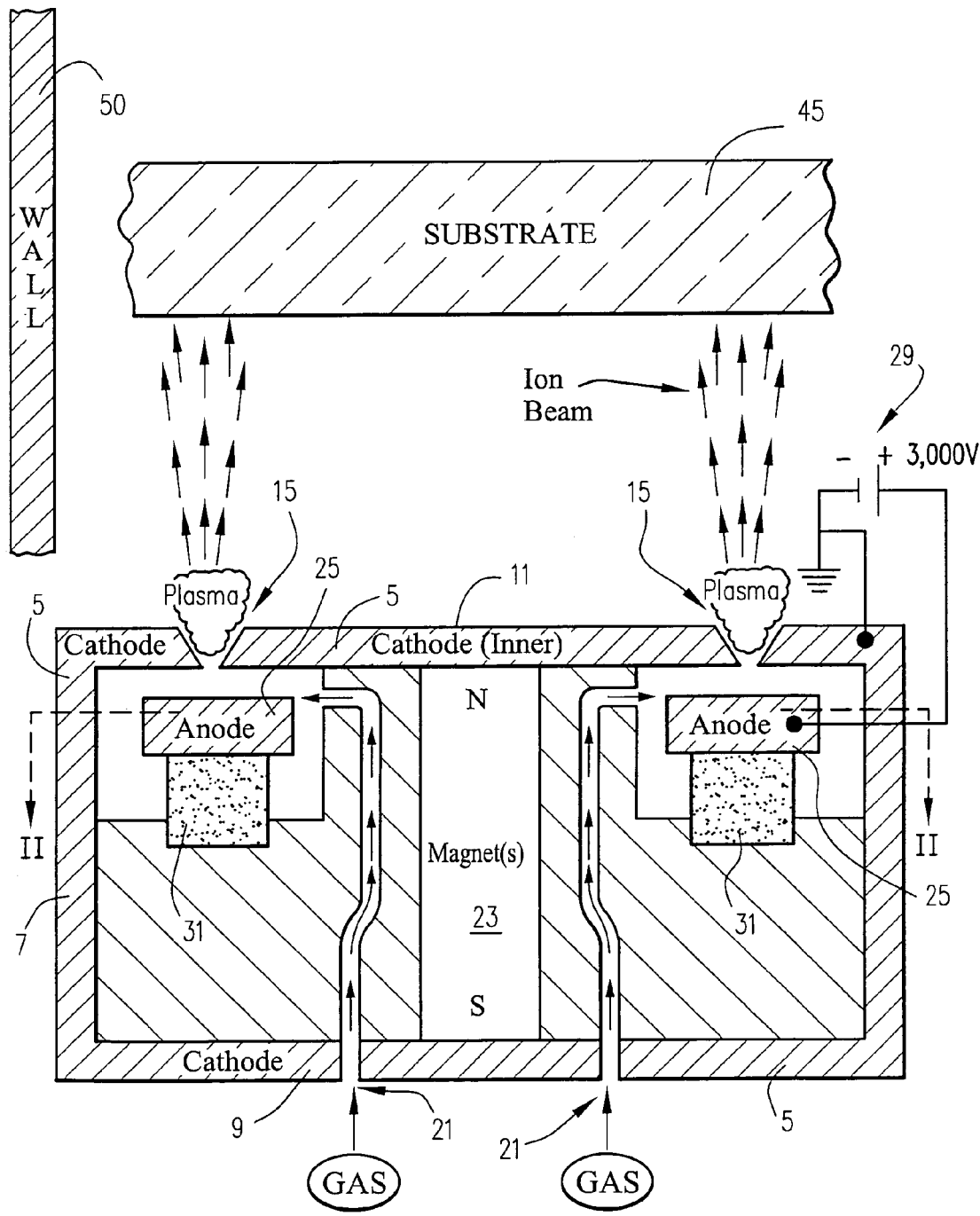
FIG. 1 is a schematic partial cross-sectional view of a conventional ion source.
Figure 2:
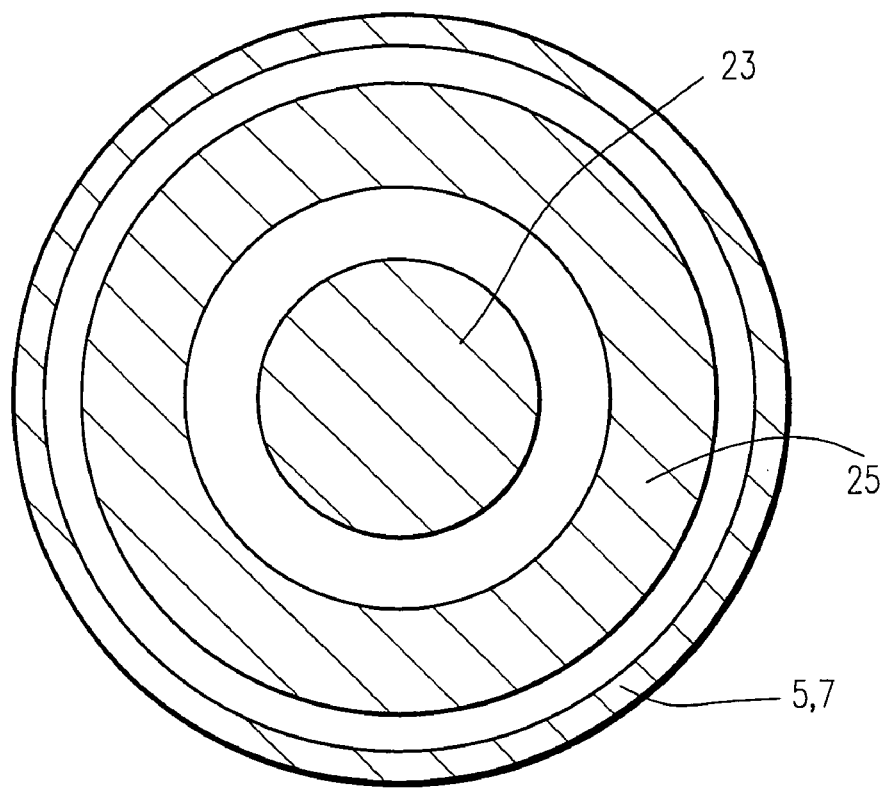
FIG. 2 is a sectional view taken along section line II-II of FIG. 1.
Figure 3:
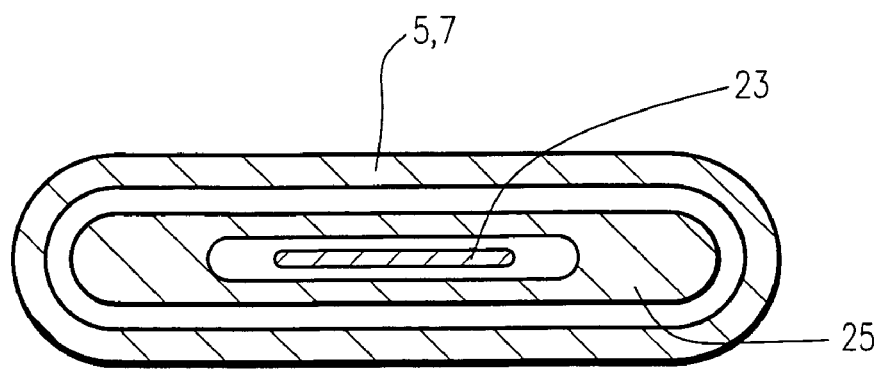
FIG. 3 is a sectional view similar to FIG. 2, taken along section line II-II in FIG. 1, in another embodiment illustrating that the ion source may be shaped in an oval manner instead of in a circular manner.

DETAILED DESCRIPTION OF EXAMPLE
EMBODIMENTS OF THE INVENTION OF THE
INVENTION

Referring now more particularly to the accompanying drawings in which like reference numerals indicate like parts throughout the several views.

In certain example embodiments of this invention, the ion source is of the cold-cathode closed drift type, as shown in FIGS. 1-11. The magnet assembly of FIGS. 6-11 is usable in the ion source of FIGS. 1-5 in certain example embodiments, although the magnet assembly of FIGS. 6-11 may instead be used in other types of ion sources in other embodiments of this invention.

Figure 6:
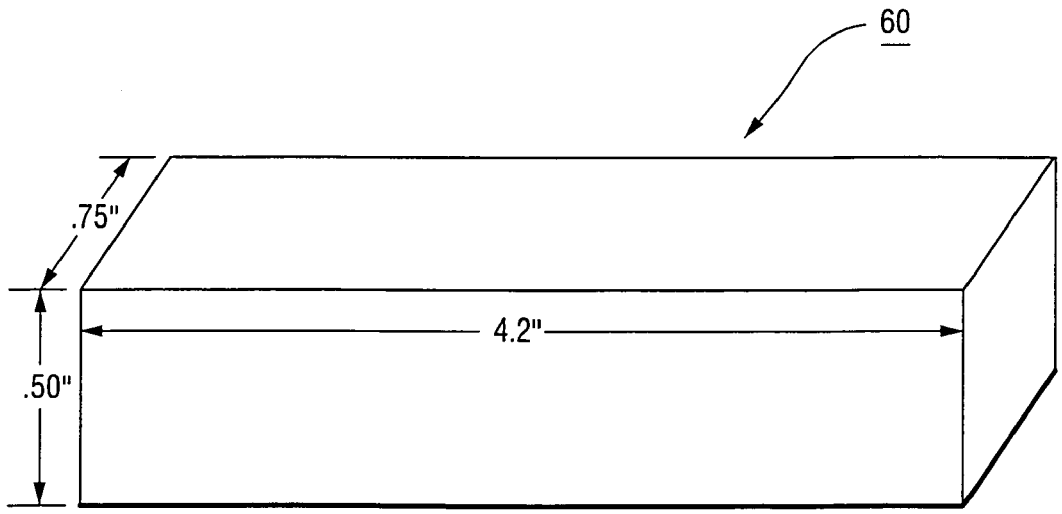
FIG. 6 is a sample magnet in accordance with an example embodiment.

FIG. 6 illustrates a sample magnet 60 in accordance with an example embodiment of this invention. Magnet 60 as shown in FIG. 6 has a rectangular prism shape. One preferred set of dimensions for magnet 60 is 4.2×0.75×0.5" although other dimensions may instead be used, and a source in certain example embodiments may include three such magnet 60. In certain example embodiments of this invention, the magnet 60 has a length which is at least twice as large as its width and/or height (more preferably at least three times as large, and possibly at least four times as large). It has been determined that the dimensions and numbers of magnets as disclosed herein tend to produce ion beams which may be diffused, collimated or focused as desired. The dimensions, numbers and/or chemistry of the magnets may be varied to change the ion beam produced, as required by, for example, the particular application for which the ion source is being used.

An example advantage of magnet 60 shown in FIG. 6 relates to its simple design. More particularly, magnet 60 is more basic and easier to produce than are the stacks of magnets forming a cylinder conventionally required. The simpler design of magnet 60 reduces difficulties during the machining of the magnets and when creating the bores. The rectangular prism shape of the magnet 60 also reduces the amount of material lost during machining, compared to the cylindrical shapes of the conventional systems. Thus, costs can be reduced because of, for example, the reduced amount of material required for, and reduced amount of waste resulting from, the machining of the magnets and bores.

Figure 4:
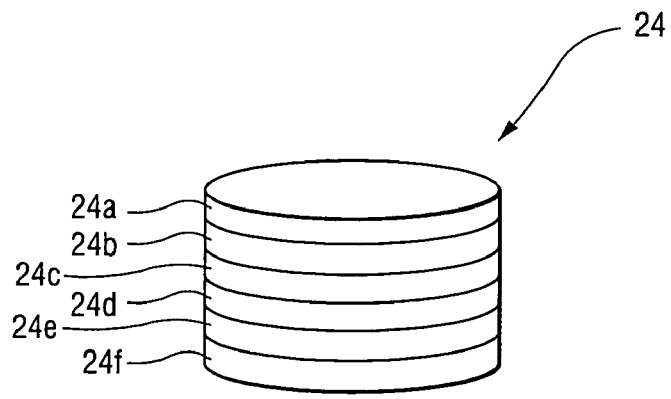
FIG. 4 shows a stack of magnets used in a prior art magnet system.
Figure 5:
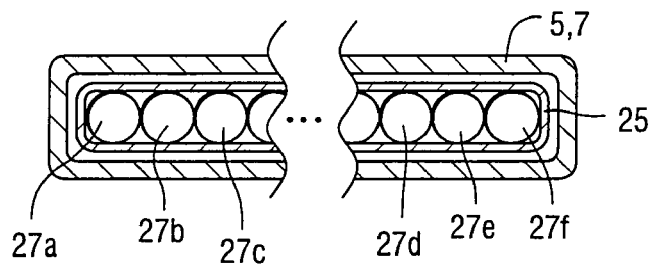
FIG. 5 is a sectional view similar to FIG. 3, taken along section line II-II in FIG. 1, showing how the stacks of magnets included in the magnet system are disposed throughout the ion source.

Rather than boring a large number of holes as shown in FIGS. 4-5 and depositing stacks of magnets therein, certain example embodiments provide a yoke system configured to hold a smaller number of larger magnets of the type shown in FIG. 6. More particularly, FIG. 7 illustrates a sample lower yoke 70 in accordance with an example embodiment of this invention. Lower yoke 70 may be configured to receive three magnets like magnet 60, although the number and/or shapes of the magnets may vary in different embodiments of this invention. For purposes of example and without limitation, an example set of dimensions for lower yoke 70 is 12.838× 0.752×0.548". However, it will be appreciated that both the dimensions of the yokes and magnets are provided by way of example and without limitation, and either or both may be varied in different embodiments of this invention. The yokes may be made out of 1008 mild steel in certain example embodiments of this invention, although other materials may instead be used in certain other instances.

Between and abutting each magnet 60, screw plates 72*a*, 72*b* having screw holes 74*a*, 74*b* may be provided. For purposes of example only and without limitation, the screw plates 72*am* 72*b* may be about 0.392" wide in certain example instances. Additionally, the screw plates 72*am* 72*b* may be slightly raised relative to the main part of yoke 70. Thus, small, well-defined areas are formed into which each magnet 60 may be placed as shown in FIGS. 7-8. In certain example embodiments, an additional screw plate may be provided at one or both of the outer ends of lower yoke 70 and/or the upper yoke.

The substantially rectangular magnets 60*a*, 60*b*, 60*c* may be cemented in and/or adhered, glued, or otherwise connected to the yokes as shown in FIG. 8 using any suitable material. In particular, FIG. 8 shows magnets 60*a-c* placed on a lower yoke in accordance with an example embodiment of this invention, between and/or adjacent plates 72*a*, 72*b*. The three simplified magnets 60*a-c* are placed in areas delineated by one or more plates 72*a*, 72*b*.

Figure 9:
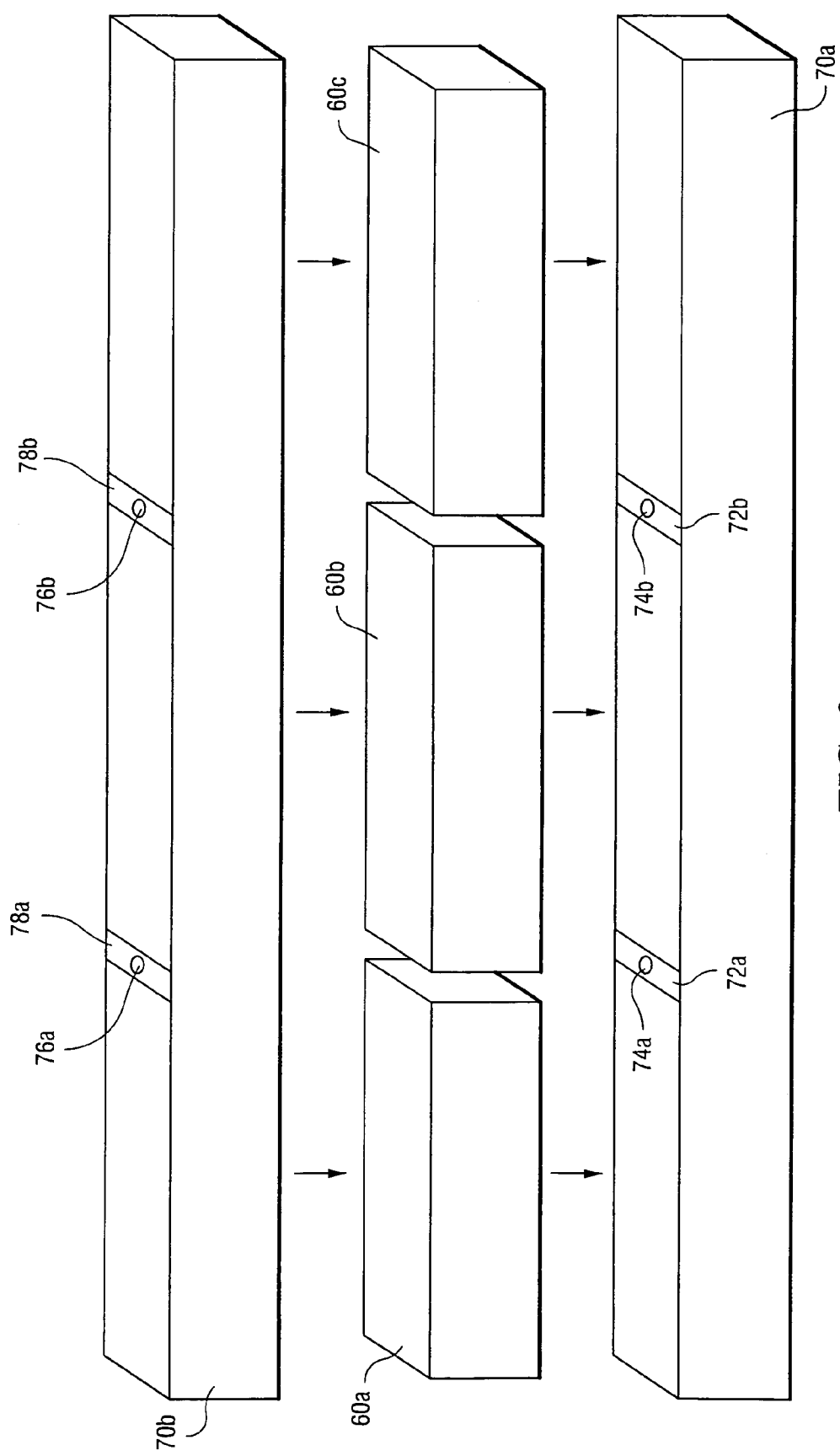
FIG. 9 is an exploded view of magnets within a magnetic yoke in accordance with an example embodiment.
Figure 10:
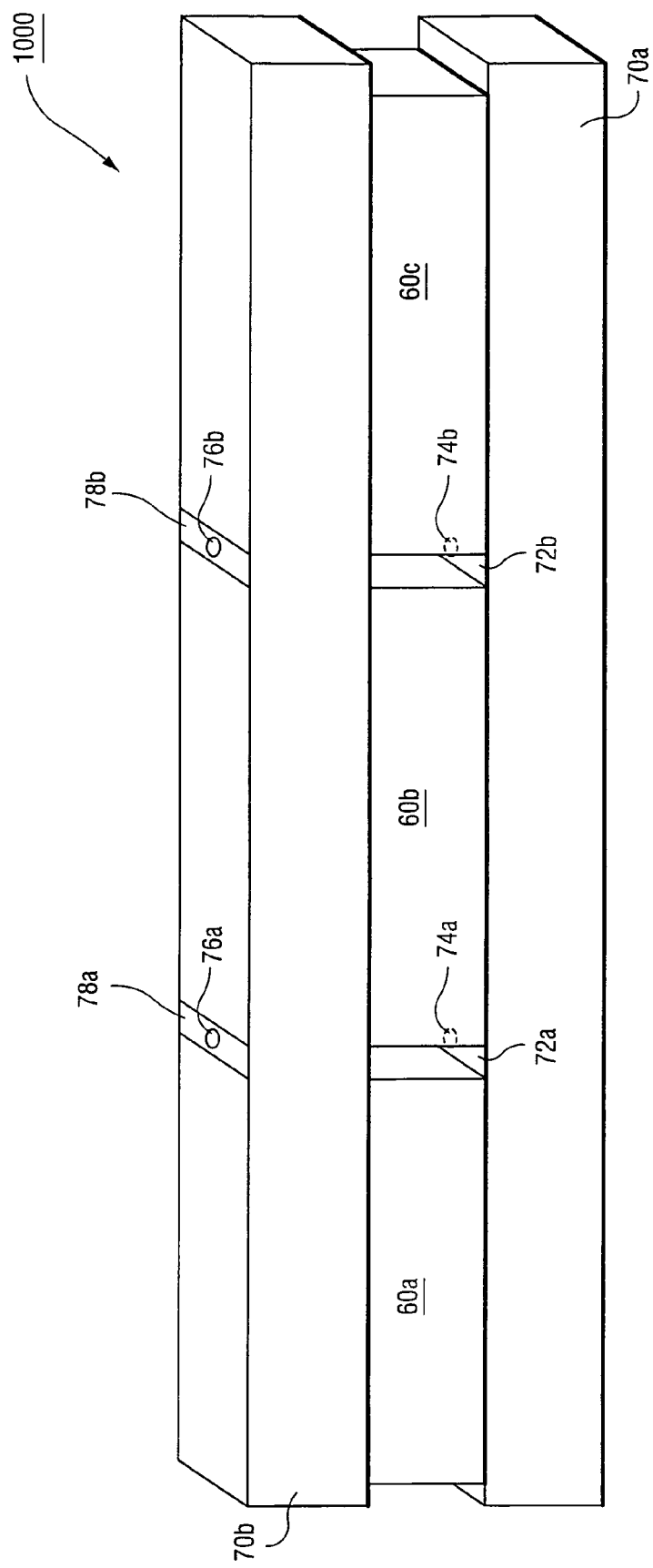
FIG. 10 is a view of a complete yoke assembly in accordance with an example embodiment; and, FIG. 11 shows a complete yoke assembly being placed into an ion source in accordance with an example embodiment.
Figure 11:
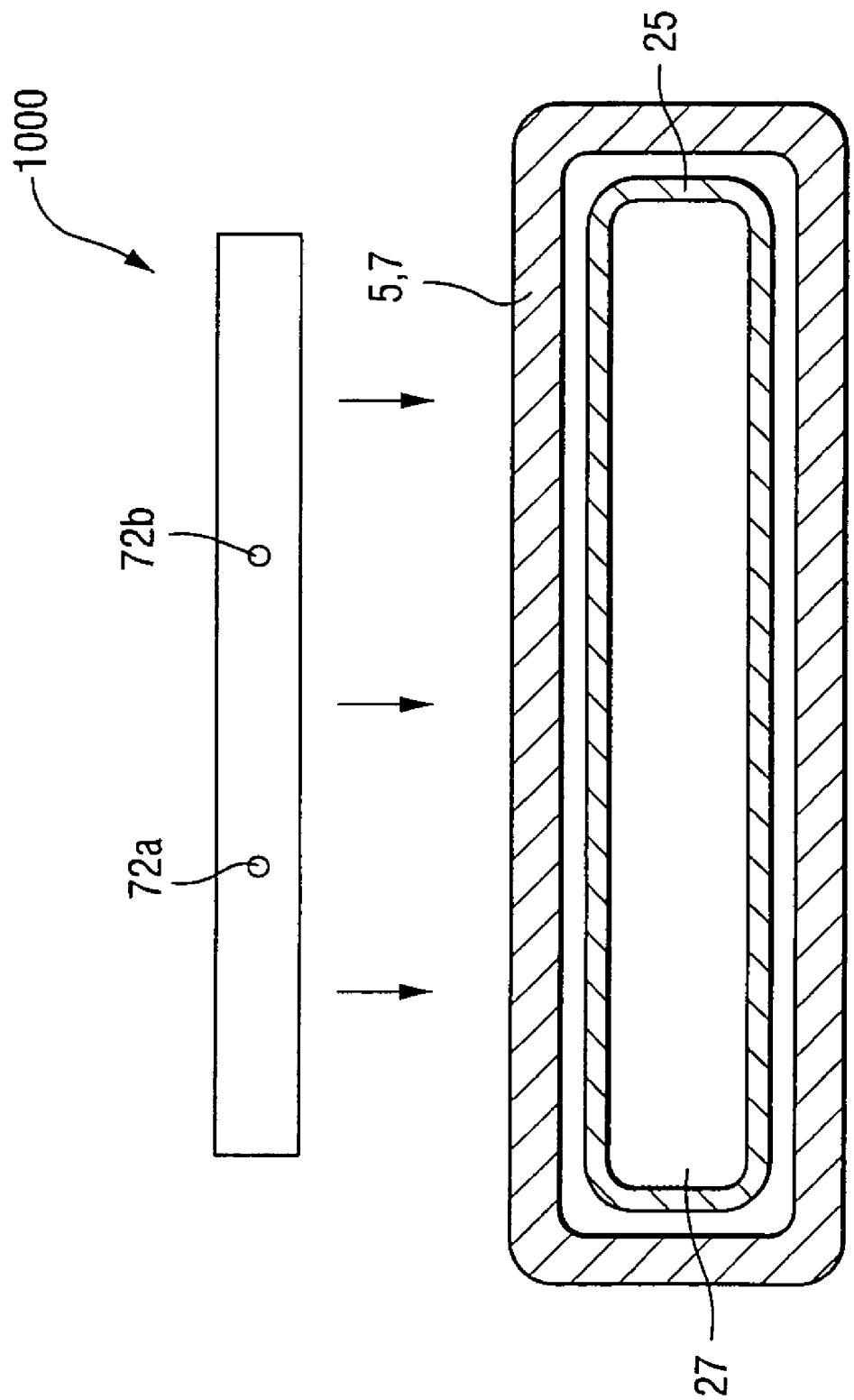

FIG. 9 is an exploded view of magnets within a magnet yoke in accordance with an example embodiment of this invention, and FIG. 10 is a view of a yoke assembly 1000 in accordance with an example embodiment of this invention. FIG. 11 shows yoke assembly 1000 being placed into an ion source in accordance with an example embodiment of this invention. As perhaps best shown in FIG. 11, the complete yoke assembly 1000 may be placed in the ion source in a single bore 27 in the area where the bores 27*a-f* conventionally were located so that the yoke assembly 1000 is surrounded by the anode 25 as viewed from above. For existing ion sources, this area may be completely machined out so that the magnets and/or yoke assemblies may be inserted therein for retrofitting. For new ion sources, a large recession or bore 27 may be formed so as to receive the magnets and/or the yoke assembly 1000. In certain example embodiments, the bottom of the inner cathode may rest on top of the upper yoke. In certain example embodiments, the area receiving the yoke assembly may be thought of as a single, large bore 27.

FIG. 9 and FIG. 10 illustrate lower yoke 70*a* and upper yoke 70*b*. Upper yoke 70*b* may be constructed similar to lower yoke 70*a* as described above in certain example embodiments of this invention. Magnets 60*a-c* may be adhered to upper yoke 70*b* similar to the process used for adhering them to lower yoke 70*a*, as described above.

In certain example embodiments, screw or other fastener plates 72*a*, 72*b* and screw or other fastener holes 74*a*, 74*b* in lower yoke 70*a* may differ from screw or other fastener plates 78*a*, 78*b* and screw or other fastener holes 76*a*, 76*b* in upper yoke 70*b*. In certain example embodiments, screw plates 72*a-b* and screw holes 74*a-b* in lower yoke 70*a* may be threaded, whereas screw plates 78*a-b* and screw holes 76*a-b* in upper yoke 70*b* may not be threaded. Bolts (not shown) may be fed through the upper holes 76*a*, 76*b* in a non-threaded manner, and threaded through the bottom holes 74*a*, 74*b*, respectively. This may help reduce problems (e.g. breakage, accumulation of dirt or debris, etc.) during shipment and installation. When the assemblies are installed, the bolts or other fasteners may be removed in certain example instances.

Having only one set of threaded screw plates and screw holes may be advantageous during removal of the yoke assembly. For example, once threaded through the holes, a bolt may push against the source, forcing the magnets and yoke assembly from the source. More particularly, to remove an installed assembly, when only the lower yoke has threaded holes, the bolts may push against the bottom of the source as they are turned, thereby pushing the full assembly out of the source. However, it will be appreciated that multiple sets of threaded screw plates and screw holes may be provided in certain embodiments of this invention.

Example embodiments disclosed herein provide several example advantages. In general, a single magnet yoke assembly including a number of magnets is easy to handle during initial installation. It also is easy to handle when the ion source is serviced, thereby resulting in improved efficiency. Thus, temporary removal and replacement of the magnet assembly may be easier than with certain conventional techniques. In certain example embodiments, only one large piece needs to be removed, compared to a large number of small, free-floating cylindrical magnets typical of conventional systems. Also, because the magnets may be cemented or otherwise adhered to one or both of the yokes, the magnets will not move around very much within the yoke, and the yoke will not significantly move inappropriately within the ion source. Thus, the chance of damage to the magnet(s) may be reduced. Also, the amount of foreign material and/or debris (e.g. small shards of broken magnets, dirt, and the like) becoming lodged between the magnets, the magnets and the yoke, and between the surface of the yoke and the other parts of ion source, may be reduced. As noted above, this is advantageous because it reduces both the chance of damage to the magnets as well as potentially adverse effects on the magnetic flux density (e.g. as caused by an air gap being formed by the debris). Reducing accumulation of debris also may reduce cleaning and maintenance requirements, saving time and/or money.

Although the example embodiments herein have been described as relating to multiple magnets being placed within a magnetic yoke, the invention is not so limited. For example, in certain example embodiments, the larger, simpler magnets may be placed in the ion source without the yoke. In certain other example embodiments, each ion source may include several yoke assemblies, with each yoke assembly include one or more magnets. According to such embodiments, the magnets within the yoke assemblies could be replaced with different magnets having different chemistries. Alternatively, or in addition, one or more pre-configured yoke assemblies may be provided to replace an entire yoke assembly. Accordingly, the resulting ion beam may be altered. For example, multiple yoke assemblies having different magnets included therewith could produce variable magnetic flux densities to change the resulting ion beam. In other example alternative embodiments, only one magnet may be used.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A magnet yoke assembly for use in an ion source, comprising:
    a lower yoke and an upper yoke; and,
    at least one magnet disposed between the lower yoke and the upper yoke, the at least one magnet having a substantially rectangular shape;
    wherein the at least one magnet is adhered to the lower yoke and/or the upper yoke;
    at least two fastener holes formed in each of the lower yoke and the upper yoke; and
    a plate aligned with each fastener hole, each plate being supported on a magnet-facing surface of the lower yoke and/or upper yoke;
    wherein the fastener holes and the plates are configured to receive fasteners for attaching the upper and lower yokes to one another.

2. The magnet yoke assembly of claim 1, wherein at least three magnets are disposed between the lower yoke and the upper yoke.

3. The magnet yoke assembly of claim 1, wherein each plate on the lower yoke and each fastener hole on the lower yoke is threaded.

4. The magnet yoke assembly of claim 1, wherein a plurality of plates on the lower yoke protrude therefrom forming protrusions and recessions, and wherein at least one magnet is located in each recession.

5. The magnet yoke assembly of claim 1, wherein the upper and lower yokes are substantially parallel to each other.

6. The magnet yoke assembly of claim 1, wherein the upper and/or lower yoke(s) are made of steel.

7. A magnet yoke assembly for use in an ion source, comprising:
    a lower yoke and an upper yoke; and,
    at least one magnet disposed between the lower yoke and the upper yoke, the at least one magnet having a substantially rectangular shape;
    wherein the at least one magnet is adhered to the lower yoke and/or the upper yoke; and
    wherein the magnet has a length which is at least twice as large as its width.

8. An ion source capable of emitting an ion beam, comprising:
    an anode and a cathode, one of the anode and cathode having a discharge gap defined therein;
    a power supply in electrical communication with the anode and/or the cathode; and,
    at least one magnet yoke assembly operable to generate a magnetic field proximate to the discharge gap, the at least one magnet yoke assembly comprising:
        a lower yoke and an upper yoke; and,
        at least one magnet disposed between the lower yoke and the upper yoke, the at least one magnet having a substantially rectangular shape;
        wherein the at least one magnet is adhered to the lower yoke and/or the upper yoke, and wherein the magnet has a length which is at least twice as large as its width.

9. The ion source of claim 8, wherein the at least one magnet yoke assembly includes at least three magnets disposed between the upper and lower yokes.

10. The ion source of claim 8, wherein the upper and lower yokes are substantially parallel to each other.

11. An ion source capable of emitting an ion beam, comprising:
    an anode and a cathode, one of the anode and cathode having a discharge gap defined therein;
    a power supply in electrical communication with the anode and/or the cathode; and,
    at least one magnet yoke assembly operable to generate a magnetic field proximate to the discharge gap, the at least one magnet yoke assembly comprising:
        a lower yoke and an upper yoke; and,
        at least one magnet disposed between the lower yoke and the upper yoke, the at least one magnet having a substantially rectangular shape;
    wherein the at least one magnet is adhered to the lower yoke and/or the upper yoke;
    wherein the magnet yoke assembly further comprises:
        at least two screw holes formed in each of the lower yoke and the upper yoke; and,
        a screw plate aligned with each screw hole, each screw plate having an screw-receiving aperture defined therein and being disposed on a magnet-facing surface of the lower yoke and/or upper yoke;
        wherein the screw holes and the screw plates are configured to receive fasteners.

12. The ion source of claim 11, wherein each screw plate on the lower yoke and each screw hole on the lower yoke is threaded.

13. The ion source of claim 11, wherein a plurality of screw plates on the lower yoke protrude therefrom forming protrusions and recessions.

14. The ion source of claim 13, wherein the at least one magnet is disposed in each of the recessions.

15. The ion source of claim 11, wherein at least one of the fasteners is configured to be turned to cause the at least one magnet yoke assembly to separate from the ion source.

16. A method of making an ion source, the method comprising:
providing a lower yoke and an upper yoke;
positioning at least one substantially rectangular-shaped magnet between the upper yoke and the lower yoke;
adhering the at least one magnet to the upper yoke and/or the lower yoke to form a magnet yoke assembly;
positioning the magnet yoke assembly in an ion source so that the magnet yoke assembly is substantially surrounded by the anode and/or cathode of the ion source as viewed from above; and
bolting together the upper yoke and the lower yoke using at least two screw holes formed in the lower yoke and at least two screw holes formed in the upper yoke, the at least two screw holes of the lower yoke and the at least two screw holes of the upper yoke being aligned.

17. The method of claim 16 further comprising removing the bolts, and after removing the bolts inserting the magnet yoke assembly in the ion source.

18. The method of claim 16, wherein the magnet yoke assembly is positioned in the ion source so that a bottom of an inner cathode of the ion source rests on a top surface of the upper yoke of the magnet yoke assembly.

19. An ion source capable of emitting an ion beam, comprising:
an anode and a cathode, one of the anode and cathode having a discharge gap defined therein;
a power supply in electrical communication with the anode and/or the cathode; and,
at least one magnet yoke assembly operable to generate a magnetic field proximate to the discharge gap, the at least one magnet yoke assembly comprising:
a lower yoke and an upper yoke; and,
at least one magnet disposed between the lower yoke and the upper yoke;
wherein the magnet has a length which is at least twice as large as its width and/or height.

20. The ion source of claim 19, wherein the at least one magnet has a rectangular prism shape.

21. The ion source of claim 19, wherein the at least one magnet is adhered to the lower yoke and/or the upper yoke via a layer of adhesive.

22. The ion source of claim 19, wherein the magnet has a length which is at least three times as large as its width and/or height.

* * * * *